United States Patent [19]

Shiga

[11] Patent Number: 5,227,738
[45] Date of Patent: Jul. 13, 1993

[54] MULTISTAGE AMPLIFIER

[75] Inventor: Nobuo Shiga, Kanagawa, Japan

[73] Assignee: Sumitomo Electric Industries, Ltd., Tokyo, Japan

[21] Appl. No.: 981,945

[22] Filed: Nov. 24, 1992

Related U.S. Application Data

[63] Continuation of Ser. No. 796,837, Nov. 25, 1991, abandoned.

[30] Foreign Application Priority Data

Nov. 27, 1990 [JP] Japan .................................. 2-323725

[51] Int. Cl.$^5$ .............................................. H03F 3/60
[52] U.S. Cl. ...................................... 330/307; 330/286
[58] Field of Search ................ 330/66, 277, 286, 295, 330/307, 311; 357/41

[56] References Cited

U.S. PATENT DOCUMENTS

| | | | |
|---|---|---|---|
| 3,969,745 | 7/1976 | Blocker, II | 357/22 |
| 4,611,184 | 9/1986 | Kumar | 333/100 |
| 4,837,536 | 6/1989 | Honjo | 330/286 X |

FOREIGN PATENT DOCUMENTS 2618947 3/1989 France .

OTHER PUBLICATIONS

Schellenberg et al., "A New Approach to FET Power Amplifiers," *Microwave Journal* 176, (1982), pp. 51–66.

Primary Examiner—Steven Mottola
Attorney, Agent, or Firm—Cushman, Darby & Cushman

[57] ABSTRACT

A multistage amplifier for amplifying an input signal so as to output an amplified signal. The multistage amplifier is comprised of a plurality of transistors that are monolithically formed around a central VIA hole. Predetermined electrodes of the respective transistors are electrically connected to each other in the area immediately surrounding the central VIA hole and are connected to the VIA hole itself. This allows for a reduction of the number of VIA holes used over conventional methods. The distance between the central VIA hole and the predetermined electrodes of each of the transistors is minimal, as is the wiring pattern of each of the electrodes. No scattering is caused by the characteristics of the transistors, as they are monolithically formed in the same manufacturing process.

16 Claims, 3 Drawing Sheets

MULTISTAGE AMPLIFIER

This is a continuation of application Ser. No. 07/796,837, filed on Nov. 25, 1991, which was abandoned upon the filing hereof.

BACKGROUND OF THE INVENTION

1. Field of the Invention

The present invention relates to a multistage amplifier constituted by field effect transistors (FETs) connected to each other in multiple stages. The transistors are monolithically formed around a central VIA hole. Predetermined electrodes of the various transistors are electrically connected to each other in the area immediately surrounding the central VIA hole.

2. Description of Related Art

A wiring pattern of a conventional multistage FET amplifier on a semiconductor substrate is shown in FIG. 5 (Prior Art). This is the pattern that is revealed in FIG. 7 of the paper entitled "X-Band Monolithic Four-Stage LNA with Pulse-doped GaAs MESFETs" in the document "GaAs IC Symposium Tech. Digest, 1990."

This prior art multistage FET amplifier is a four-stage amplifier in which four FETs 1 through 4 are connected to each other in four stages. Each of the FETs 1 through 4 is provided with a source electrode S, a drain electrode D, and a gate electrode G. The four FETs are monolithically formed on one semiconductor substrate. A lengthy wiring pattern is repeated in the prior art, as shown in FIG. 5 (Prior Art), between each FET, so that a multistage connection is formed from the first stage FET 1 through the final stage FET 4.

A second conventional construction of a multistage FET amplifier is an arrangement of a plurality of FETs in a single integrated circuit (IC) package with external FET interconnection wiring. A third arrangement exists in which a plurality of FETs, formed independently of each other in separate IC packages, are utilized and externally wired to constitute a multistage FET amplifier.

Each of the conventional multistage FET amplifiers revealed by prior art has problems. The multistage FET amplifier monolithically formed on a semiconductor substrate, as shown in FIG. 5, is relatively large in size. The size of the multistage amplifier is directly linked to the area occupied by wiring patterns and the number of VIA holes used. Each of the FETs 1 through 4 has two wiring patterns connected to its source electrode S and each of these wiring patterns is connected to a separate and distinct VIA hole H. Accordingly, the area occupied with the wiring patterns on the semiconductor substrate is large and the number of VIA holes required is great. This has an adverse effect on the size of the multistage amplifier and on the manufacturing yield.

The conventional multistage FET amplifier that comprises a plurality of FETs contained in a single IC package and external FET interconnection wiring also has problems. The external wiring that is required for this multistage amplifier considerably adds to its size and decreases the manufacturer's efficiency.

A conventional multistage FET amplifier constituted by using a plurality of FETs in independent IC packages is larger than a monolithically formed multistage FET amplifier. These multistage amplifiers have an additional problem. Scattering is introduced into the multistage amplifier because the characteristics of the FETs are different, as they were manufactured independently. Accordingly, the characteristics of such a multistage amplifier are unstable.

SUMMARY OF THE INVENTION

The present invention has been attained in order to solve the problems of large size, low manufacturing yield, poor manufacturing efficiency, and instability caused by scattering as seen in the prior art. The object thereof is to provide a multistage amplifier constituted by a plurality of transistors for multistage amplifying an input signal so as to output an amplified signal. These transistors are monolithically formed around a central VIA hole. Predetermined electrodes of the respective transistors are electrically connected to each other in the area immediately surrounding the central VIA hole.

The distance between the area immediately surrounding the central VIA hole and the predetermined electrode of each of the transistors is minimal. The wiring patterns between the predetermined electrodes and the area immediately surrounding the central VIA hole is thereby kept minimal. Since the electrodes are electrically connected to each other in the area surrounding the central VIA hole, the number of VIA holes required is minimal.

Further, since the transistors are monolithically formed in the same manufacturing process, no scattering is caused in the characteristics of the transistors. This increases the multistage amplifier's stability.

DETAILED DESCRIPTION OF THE PREFERRED EMBODIMENTS

Figure 1:
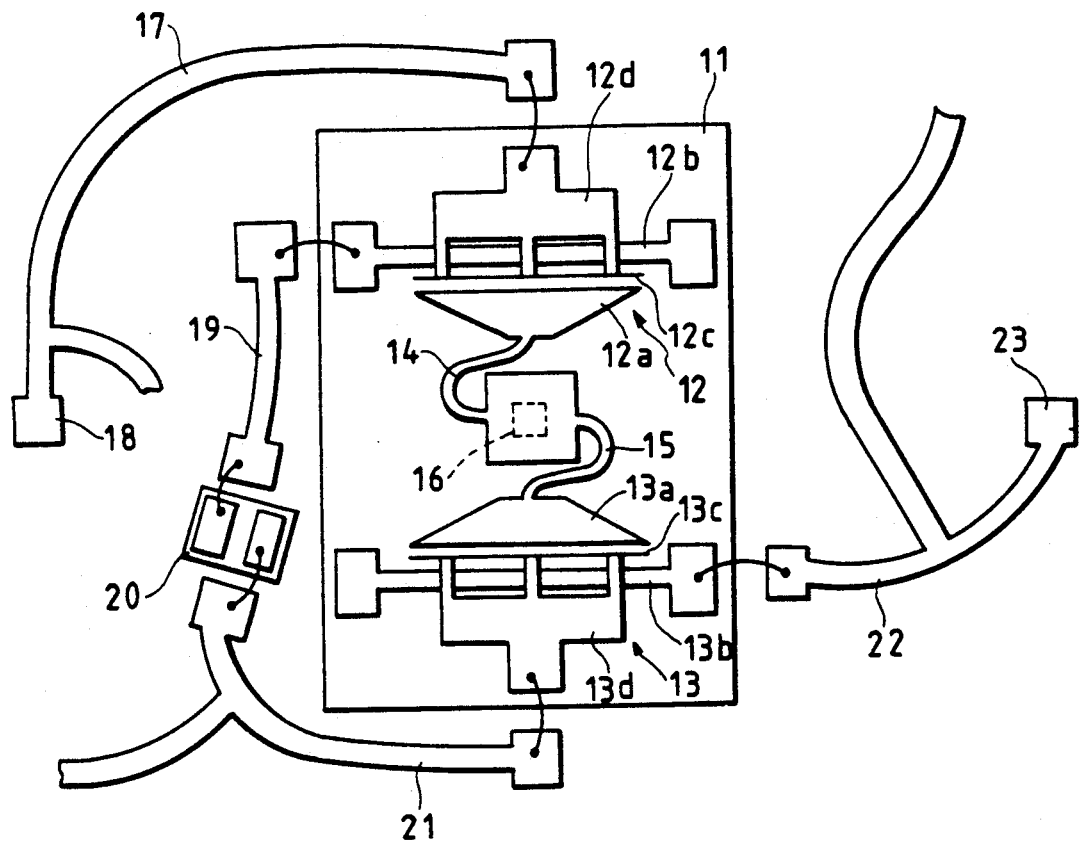
FIG. 1 is a view of a wiring pattern of the two-stage amplifier which is the first embodiment of the present invention.

The first embodiment of the present invention comprises a multistage amplifier, as shown in the wiring pattern diagram of FIG. 1. The multistage amplifier of this embodiment is constituted by two MESFETs (Schottky gate-type FETs) 12 and 13 formed on a single semiconductor chip 11. The FETs 12 and 13 are monolithically formed in opposition to each other around a central VIA hole 16 on the semiconductor chip 11. The FETs 12 and 13 are provided with source electrodes 12a and 13a, drain electrodes 12b and 13b, and gate electrodes 12c and 13c, respectively. The source electrodes 12a and 13a are electrically connected to each other in the area immediately surrounding the central VIA hole 16 of the semiconductor chip 11 through source stubs 14 and 15 respectively. Further, the connection portion is electrically connected, through the VIA hole 16, to a grounding pattern formed on the back surface of the semiconductor chip 11.

Although the source stubs 14 and 15 act as series feedback circuits in the amplification operation of the FETs 12 and 13 respectively, and are important for realizing a narrow-band amplifier, they are not always required. The source electrodes 12a and 13a may be connected directly to the VIA hole 16 without providing the respective source stubs 14 and 15.

Figure 2:
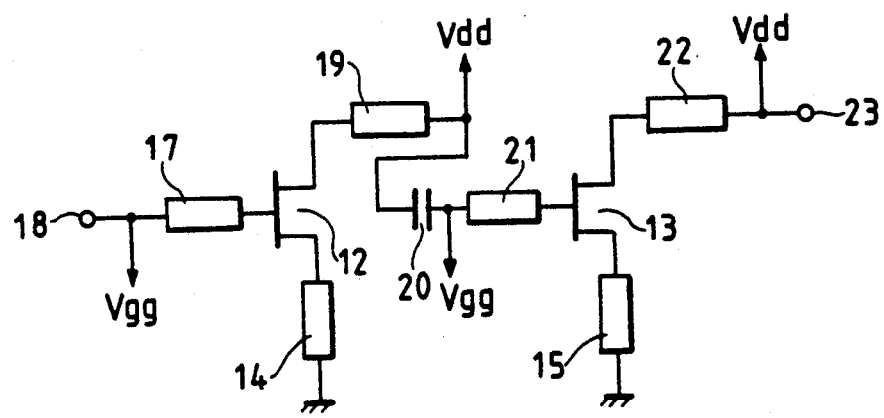
FIG. 2 is an equivalent circuit diagram of the two-stage amplifier shown in FIG. 1.

The semiconductor chip 11 is mounted on a ceramic substrate, and the FETs 12 and 13 are multi-connected to each other through wiring patterns formed on the ceramic substrate. By this multi-stage connection, a two-stage amplifier is formed as shown in the equivalent circuit in FIG. 2. A micro strip line 17 is connected through a bonding wire to a gate wire pattern 12d, which is connected to the gate electrode 12c of the FET 12. An input pad 18 to which an external input signal is applied is formed at one end of the micro strip line 17. As previously described, the source electrode 12a of the FET 12 is grounded through the source stub 14. The drain electrode 12b of the FET 12 is connected to a micro strip line 19 through a bonding wire. The micro strip line 19 is connected through a bonding wire to one electrode of a chip capacitor 20.

The other electrode of the chip capacitor 20 is connected to a micro strip line 21 through a bonding wire. The other end of the micro strip line 21 is connected through a bonding wire to a gate wiring pattern 13d of the FET 13, which is connected to the gate electrode 13c. As previously described, the source electrode 13a of the FET 13 is grounded through the source stub 15. The drain electrode 13b of the FET 13 is connected to a micro strip line 22 through a bonding wire. The micro strip line 22 is connected to an output pad 23 to which an amplified output signal of the multistage amplifier is supplied.

A power supply circuit pattern for supplying a power source to each of the FETs 12 and 13 is omitted from FIG. 1. There is a wiring pattern for supplying a power source Vgg to each of the gate electrodes 12c and 13c, and a wiring pattern for supplying a power source Vdd to each of the drain electrodes 12b and 13b.

In the two-stage amplifier of this embodiment, an impedance matching circuit is formed on the ceramic substrate, and the semiconductor chip 11 is mounted on the ceramic substrate. The FETs 12 and 13 on the semiconductor chip 11 are monolithically formed in one and the same manufacturing process, so that no scattering is caused in the characteristics of the FETs 12 and 13. Accordingly, the characteristics of the thus obtained multistage amplifier are stable.

The FETs 12 and 13 are formed around a central VIA hole. The distance between the area immediately surrounding the central VIA hole, where the source electrodes 12a and 13a are electrically connected to each other, and the source electrodes 12a and 13a is minimal. Accordingly, the wiring pattern of each of the source electrodes is minimal, the wiring pattern area of the whole multistage amplifier is minimized, and the size of the amplifier is reduced. Also the requirement of only one VIA hole 16 which makes it possible to ground the source electrodes 12a and 13a increases manufacturing yield.

Figure 3:
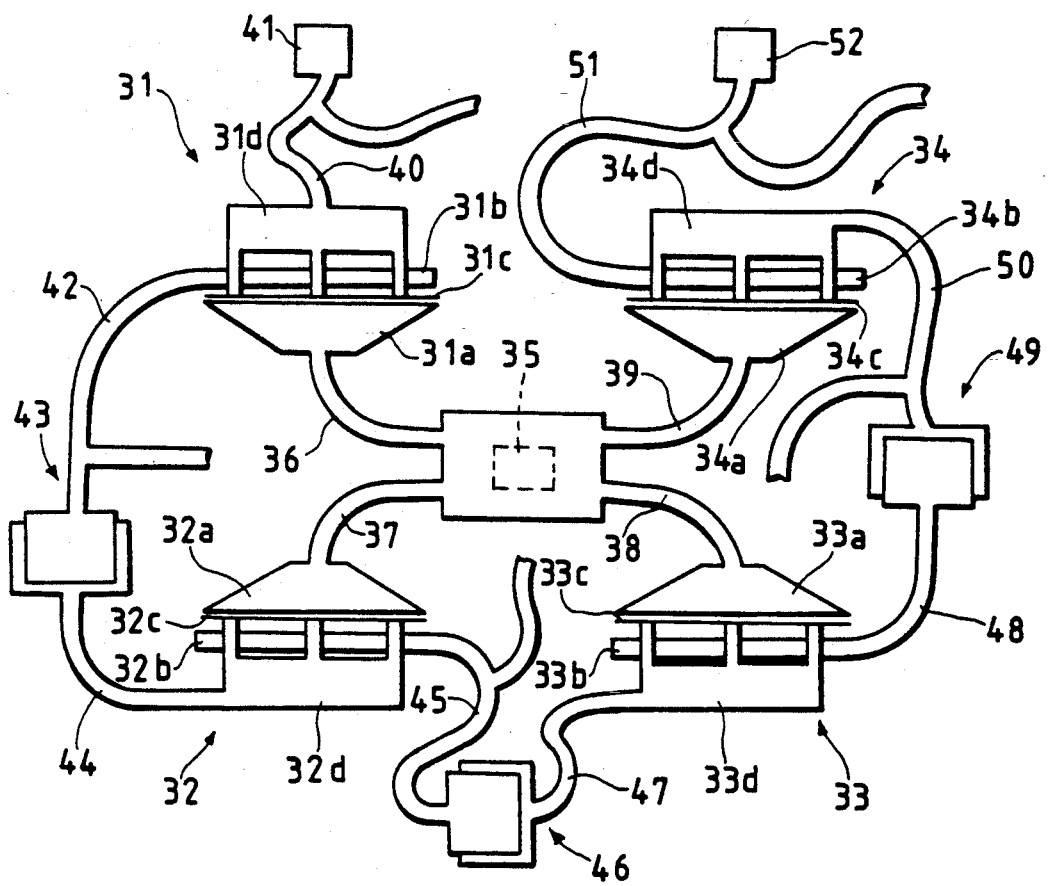
FIG. 3 is a view of a wiring pattern of the four-stage amplifier which is the second embodiment of the present invention.

The second embodiment of the present invention is a wiring pattern of a multistage amplifier as shown in FIG. 3. The multistage amplifier of this embodiment is a four-stage amplifier structure. This multistage amplifier comprises four MESFETs 31 through 34 and an impedance matching circuit which are formed on one and the same semiconductor substrate. The FETs 31 through 34 are monolithically formed around a central VIA hole 35. As in the first embodiment, the FETs 31 through 34 have source electrodes 31a through 34a, drain electrodes 31b through 34b, and gate electrodes 31c through 34c, respectively.

Figure 4:
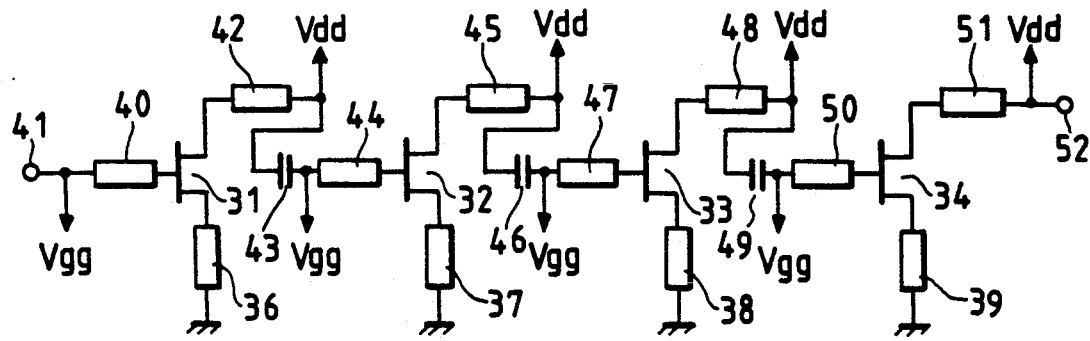
FIG. 4 is an equivalent circuit diagram of the four-stage amplifier shown in FIG. 3.
Figure 5:
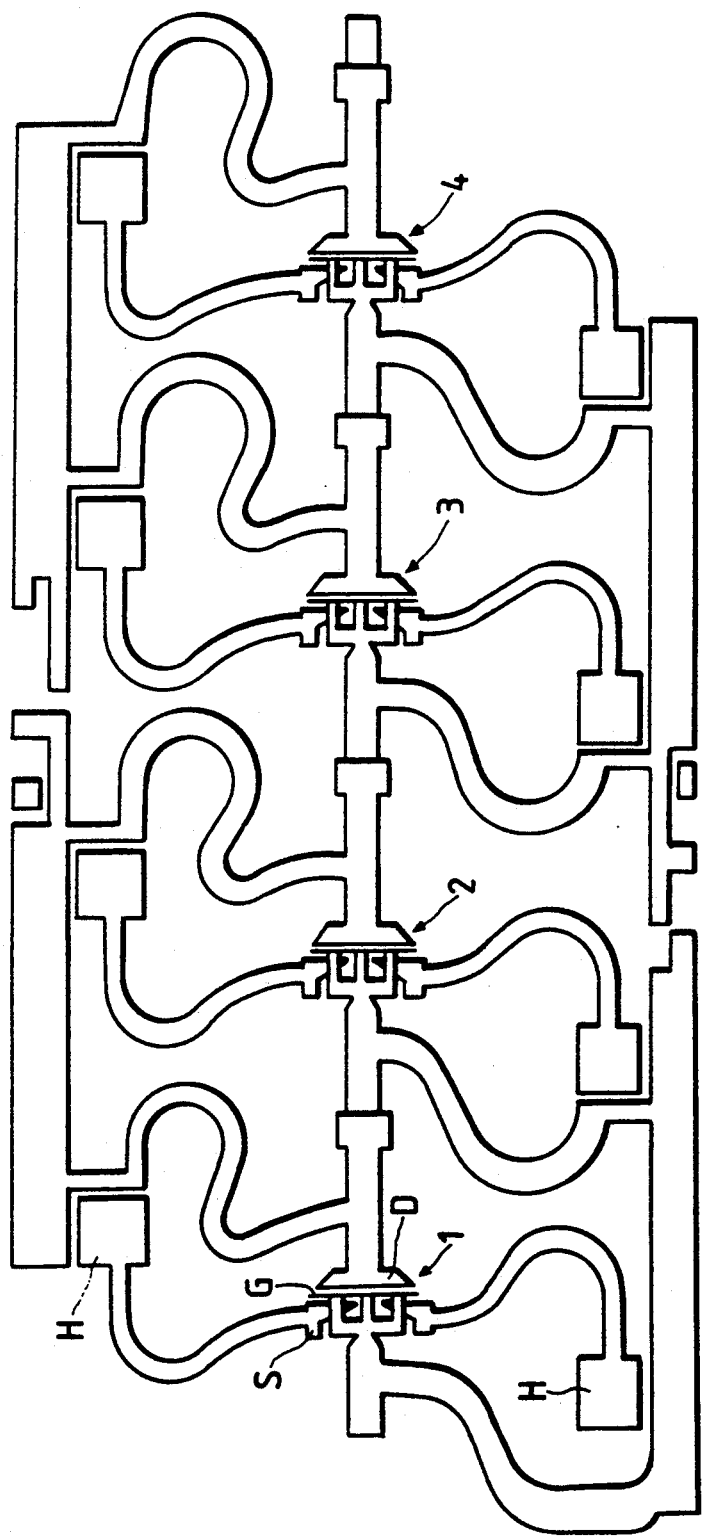
FIG. 5 (Prior Art) is a view of a wiring pattern of a conventional four-stage FET amplifier.

The FETs 31 through 34 are connected to each other in a manner to form a four-stage amplifier as shown in the equivalent circuit of FIG. 4. The source electrodes 31a through 34a are electrically connected to each other in the area immediately surrounding the central VIA hole 35 through source stubs 36 through 39, respectively. This area is electrically connected through the VIA hole 35 to a grounding pattern formed on the back surface of the semiconductor substrate.

Although the source stubs 36 through 39 act as series feedback circuits in the amplification operation of the FETs 31 through 34 respectively, and are important for realizing a narrow-band amplifier, they are not always required. The source electrodes 31a, 32a, 33a, and 34a may be connected directly to the VIA hole 35 without providing the respective source stubs 36 through 39.

In the four-stage amplifier of the second embodiment a micro strip line 40 is connected to a gate wiring pattern 31d, which is connected to the gate electrode 31c of the FET 31. An input pad 41 to which an external input signal is supplied is formed on one end of the micro strip line 40. The drain electrode 31b of the FET 31 is connected to a micro strip line 42. The micro strip line 42 is connected to one electrode of an MIM capacitor 43.

The other electrode of the MIM capacitor 43 is connected to a micro strip line 44. The other end of the micro strip line 44 is connected to a gate wiring pattern 32d of the FET 32, which is connected to the gate electrode 32c. The drain electrode 32b of the FET 32 is connected to a micro strip line 45. The micro strip line 45 is connected to one electrode of an MIM capacitor 46.

The other electrode of the MIM capacitor 46 is connected to a micro strip line 47. The other end of the micro strip line 47 is connected to a gate wiring pattern 33d of the FET 33, which is connected to the gate electrode 33c. The drain electrode 33b of the FET 33 is connected to a micro strip line 48. The micro strip line 48 is connected to one electrode of an MIM capacitor 49.

The other electrode of the MIM capacitor 49 is connected to a micro strip line 50. The other end of the micro strip line 50 is connected to a gate wiring pattern 34d of the FET 34, which is connected to the gate electrode 34c. The drain electrode 34b of the FET 34 is connected to an output pad 52 through a micro strip line 51. An amplified signal from the multistage amplifier is supplied to the output pad 52.

A power supply circuit pattern for supplying a power source to each of the FETs 31 through 34 is omitted from FIG. 3.

In a four-stage amplifier of this embodiment, the FETs 31 through 34 are monolithically formed on one and the same semiconductor substrate in one and the same manufacturing process. Accordingly, no scattering is present in the characteristics of the FETs and the multistage amplifier is stable.

Since the FETs 31 through 34 are formed around the VIA hole 35, the distance between the area immediately surrounding the VIA hole 35, where the source electrodes of the FETs 31a through 34a are electrically connected and each of the source electrodes 31a through 34a is minimal. Accordingly, the wiring pattern of each of the source electrode portions is minimal and the wiring pattern area of the whole multistage amplifier is minimized. As a result, the size of the amplifier is reduced as in the first embodiment. Also the requirement of only one VIA hole 35 which makes it possible to ground the source electrodes 31a through 34a increases manufacturing yield as in the first embodiment.

What is claimed is:

1. A multistage amplifier comprising:
a single substrate containing a central VIA hole;
a first stage comprising a first transistor having a plurality of electrodes, wherein a first electrode of said first transistor accepts an input signal and a second electrode of said first transistor outputs a first output signal; and
a second stage comprising a second transistor having a plurality of electrodes, wherein a first electrode of said second transistor accepts said first output signal and a second electrode of said second transistor outputs a second output signal,
said first transistor and said second transistor being monolithically integrated on said substrate and arranged around said central VIA hole.

2. A multistage amplifier as claimed in claim 1, wherein said first transistor is arranged so that a third electrode of said first transistor is nearer to said central VIA hole than said first electrode and said second electrode of said first transistor and said second transistor is arranged so that a third electrode of said second transistor is nearer to said central VIA hole than said first electrode and said second electrode of said second transistor.

3. A multistage amplifier as claimed in claim 2, wherein said third electrode of said first transistor and said third electrode of said second transistor are electrically coupled together an area immediately surrounding said central VIA hole, said third electrode of said first transistor and said third electrode of said second transistor not both being of the gate type.

4. A multistage amplifier as claimed in claim 3, wherein said third electrode of said first transistor and said third electrode of said second transistor are of the source type.

5. A multistage amplifier as claimed in claim 3, further comprising a grounding pattern, said grounding pattern being electrically coupled to said third electrode of said first transistor and said third electrode of said second transistor through said central VIA hole.

6. A multistage amplifier as claimed in claim 1, wherein said multistage amplifier is a two-stage amplifier.

7. A multistage amplifier as claimed in claim 1, wherein said substrate contains a single central VIA hole.

8. A multistage amplifier as claimed in claim 1, further comprising a plurality of impedance matching circuits, a first of said plurality of impedance matching circuits being electrically coupled in series to said first electrode of said first transistor, a second of said plurality of impedance matching circuits being electrically coupled in series to said second electrode of said first transistor and said first electrode of said second transistor, and a third of said plurality of impedance matching circuits being electrically coupled in series to said second electrode of said second transistor.

9. a multistage amplifier as claimed in claim 8, wherein said first of said plurality of impedance matching circuits comprises at least a microstrip, said second of said plurality of impedance matching circuits comprises at least a microstrip and at least a capacitor, and said third of said impedance matching circuits comprises at least a microstrip.

10. A four-stage amplifier comprising:
a single substrate containing a central VIA hole;
a first stage comprising a first transistor having a plurality of electrodes, wherein a first electrode of said first transistor accepts an input signal and a second electrode of said first transistor outputs a first output signal;
a second stage comprising a second transistor having a plurality of electrodes, wherein a first electrode of said second transistor accepts said first output signal and a second electrode of said second transistor outputs a second output signal;
a third stage comprising a third transistor having a plurality of electrodes, wherein a first electrode of said third transistor accepts said second output signal and a second electrode of said third transistor outputs a third output signal; and
a fourth stage comprising a fourth transistor having a plurality of electrodes, wherein a first electrode of said fourth transistor accepts said third output signal and a second electrode of said fourth transistor outputs a fourth output signal,
said first transistor, said second transistor, said third transistor and said fourth transistor being monolithically integrated on said substrate and arranged around said central VIA hole.

11. A four-stage amplifier as claimed in claim 10, wherein said first transistor is arranged so that a third electrode of said first transistor is nearer to said central VIA hole than said first electrode and said second electrode of said first transistor, said second transistor is arranged so that a third electrode of said second transistor is nearer to said central VIA hole than said first electrode and said second electrode of said second transistor, said third transistor is arranged so that a third electrode of said third transistor is nearer to said central VIA hole than said first electrode and said second electrode of said third transistor, and said fourth transistor is arranged so that a third electrode of said fourth transistor is nearer to said central VIA hole than said first electrode and said second electrode of said fourth transistor.

12. A four-stage amplifier as claimed in claim 11, wherein said third electrode of said first transistor, said third electrode of said second transistor, said third electrode of said third transistor and said third electrode of said fourth transistor are electrically coupled together in an area immediately surrounding said central VIA hole, said third electrode of said first transistor, said third electrode of said second transistor, said third electrode of said third transistor and said third electrode of said fourth transistor not all being of the gate type.

13. A four-stage amplifier as claimed in claim 12, wherein said third electrode of said first transistor, said third electrode of said second transistor, said third electrode of said third transistor and said third electrode of said fourth transistor are of the source type.

14. A four-stage amplifier as claimed in claim 12, further comprising a grounding pattern, said grounding pattern being electrically coupled to said third electrode of said first transistor, said third electrode of said second transistor, said third electrode of said third transistor and said third electrode of said fourth transistor through said central VIA hole.

15. A four-stage amplifier as claimed in claim 9, further comprising a plurality of impedance matching circuits, a first of said plurality of impedance matching circuits being electrically coupled in series to said first electrode of said first transistor, a second of said plurality of impedance matching circuits being electrically coupled in series to said second electrode of said first transistor and said first electrode of said second transistor, a third of said plurality of impedance matching circuits being electrically coupled in series to said second electrode of said second transistor and said first electrode of said third transistor, a fourth of said plurality of impedance matching circuits being electrically coupled in series to said second electrode of said third transistor and said first electrode of said fourth transistor, and a fifth of said plurality of impedance matching circuits being electrically coupled in series to said second electrode of said fourth transistor.

16. A four-stage amplifier as claimed in claim 15, wherein said first of said plurality of impedance matching circuits comprises at least a microstrip, said second, third and fourth of said plurality of impedance matching circuits each comprise at least a microstrip and at least a capacitor, and said fifth of said plurality of impedance matching circuits comprises at least a microstrip.

* * * * *